United States Patent [19]

Arima

[11] Patent Number: 4,907,198

[45] Date of Patent: Mar. 6, 1990

[54] SEMICONDUCTOR MEMORY DEVICE

[75] Inventor: Hideaki Arima, Hyogo, Japan

[73] Assignee: Mitsubishi Denki Kabushiki Kaisha, Tokyo, Japan

[21] Appl. No.: 266,058

[22] Filed: Nov. 2, 1988

[30] Foreign Application Priority Data

Dec. 2, 1987 [JP] Japan ................................. 62-306123

[51] Int. Cl.[4] ........................ G11C 11/40; G11C 13/00
[52] U.S. Cl. .................................... 365/185; 365/182; 357/23.5
[58] Field of Search .................. 365/185, 182, 189.01; 357/23.5, 45

[56] References Cited

U.S. PATENT DOCUMENTS 4,783,766  11/1988  Samachisa et al. ................. 365/185
4,847,667  7/1989  Mori .................................... 357/23.5

Primary Examiner—Terrell W. Fears
Attorney, Agent, or Firm—Lowe, Price, LeBlanc, Becker & Shur

[57] ABSTRACT

An EEPROM formed of three-layer polysilicon is provided. A floating gate is at a second level and a portion thereof is at a first level. A first control gate and a select gate are formed spaced apart from each other at the first level and a portion of the second floating gate extends between them for formation of a tunnel region. A second control gate which is kept at the same potential as the first control gate exist at a third level. In this EEPROM, electrons are drawn from the floating gate by applying a high voltage to the select gate.

9 Claims, 13 Drawing Sheets

SEMICONDUCTOR MEMORY DEVICE

BACKGROUND OF THE INVENTION

1. Field of the Invention

The present invention relates to a semiconductor memory device and, more particularly, to a structure of a nonvolatile memory capable of writing and erasing electrical information, that is, so called EEPROM (Electrical Erasable and Programmable Read Only Memory).

2. Description of the Prior Art

FIG. 1 is a block diagram showing an overall arrangement of an EEPROM.

Referring to FIG. 1, the EEPROM includes a memory array 50 formed of a plurality of EEPROM cells, a row address buffer 51 and a column address buffer 52 which receive externally applied row address signals and externally applied column address signals, respectively. The EEPROM also includes a row decoder 53 and a column decoder 54. The row decoder 53 decodes the address output from the row address buffer 51 and activates a word line coupled to a particular memory cell to be selected in the memory array while the column decoder 54 decodes the address output from the column address buffer 52 to activate a Y gate to connect a bit line coupled to the particular memory cell to I/O line. A sense amplifier 56 senses via a Y gate 55 a data signal stored in the memory cell which has been selected by the row and column decoders. The sensed signal is amplified in the sense amplifier and fed out through an output buffer 57. Included also in the EEPROM is an input buffer 58 for providing control signals to various circuits associated with the memory array.

In FIG. 2, there is shown a schematic circuit diagram of the memory array and Y gate of FIG. 1.

Referring to FIG. 2, the Y gate 55 comprises a transistor 38 connected between an I/O line 40 and a CG line 41, and a transistor 39 connected between the CG line 41 and a control gate line 35. To the gates of these transistors 38 and 39, a Y gate signal Y2 is supplied. A similar transistor arrangement is provided for a Y gate signal Y1.

In the configuration of the memory cell array of FIG. 2, only four memory cells are shown for storing four bits of data. Each memory cell comprises a floating gate transistor TR1 having a floating gate, and a select gate transistor TR2 for transferring a data signal stored in the floating gate transistor TR1 to a bit line 4. The gate of the select gate transistor TR2 is coupled to a word line 3. Another select gate transistor 34 is provided to transfer a signal on the control gate line 35 to the gate of the floating gate transistor TR1 The gate of the select gate transistor 34 is coupled to the word line 3.

To briefly describe the operation, the floating gate transistor TR1 is capable of taking two different storage or logic states depending on whether electrons are accumulated on its floating gate or not. When electrons are injected into the floating gate of the transistor TR1, the threshold voltage of the transistor shifts high, and therefore the transistor is non-conductive during readout operation. This condition is defined as a logic "1" state. On the other hand, when electrons are removed from the floating gate, the threshold voltage of transistor TR1 shifts low, and the transistor TR1 is conducting during the read-out operation. This condition is defined as a logic "0" state.

The sense amplifier provides a read-out voltage to the bit line 4 via the transistor 38. From the bit line 4, the read-out voltage is fed to the floating gate transistor TR1 through the transistor TR2. This enables the sense amplifier to detect whether the current flows through the transistor TR1 or not, that is, to read the stored data of the floating gate transistor TR1

FIG. 3A is a plan view showing a conventional EEPROM having a floating gate. FIG. 3B is a sectional view taken along the line IIIB—IIIB of FIG. 3A. Referring to FIGS. 3A and 3B, a description is made of a structure of the EEPROM.

The EEPROM comprises a floating gate transistor TR1 and a select gate transistor TR2 formed on a main surface of a silicon semiconductor substrate 11. The floating gate transistor TR1 comprises a drain region 8 and a source region 9 both formed on the main surface of the semiconductor substrate 11, a thin tunnel oxide film 6 formed on a predetermined region of the drain region 8, a floating gate 2 formed of polysilicon through an insulating film on a region of the semiconductor substrate 11 comprising at least the tunnel oxide film 6, and a control gate 17 formed on the floating gate 2 through an insulating film. The control gate 17 and the floating gate 2 form capacitance in an overlapping region with each other using the insulating film therebetween (an interlayer insulating film) as a dielectric material. The floating gate 2 and the drain region 8 form capacitance in a region in which the tunnel oxide film 6 is formed using the tunnel oxide film 6 as a dielectric material. In addition, the floating gate 2 and the semiconductor substrate 11 also form capacitance in a region other than the tunnel oxide film 6.

The floating gate 2 stores an electric charge. A discharge/charge of an electric charge is carried out between the floating gate 2 and the drain region 8 through the tunnel oxide film 6 in response to a voltage applied between the control gate 17 and the drain region 8.

The select gate transistor TR2 comprises the source region 8 (also used as the drain region of the floating gate transistor) and a drain region 12 both formed on the main surface of the semiconductor substrate 11, and a gate electrode 3 serving as a word line. The drain region 12 is connected to a bit line 4 through a contact hole 5.

The select gate transistor TR2 is turned on and off in response to a signal applied through a word line 3, whereby information of the floating gate transistor TR1 connected to the select transistor TR2 is read on the bit line 4. In addition, one cell of EEPROM including TR1 and TR2 is electrically insulated from adjacent cells by a region 10 for isolating devices.

Now, a description is made of operation of the EEPROM. EEPROM has three basic operational mode, such as Read Erase and Write.

The following table shows the potentials which are applied to the various elements of the device herein described in order to read, erase and write any charge on floating gate 2. The various potentials shown under the columns entitled "READ" "ERASE" and "WRITE" are applied to those elements shown under the column entitles "ELEMENT" in the following table:

| ELEMENT | READ | ERASE | WRITE |
|---|---|---|---|
| Select gate 3 | 5V | $V_{pp}$ | $V_{pp}$ |
| Control gate 17 | 0V | $V_{pp}$ | 0 |
| Bit line 4 | 2V | 0V | $V_{pp}$ |
| Source line 9 | 0V | 0V | Floating |
| Floating gate 2 | $V_F$ | $V_E$ | $V_W$ | where $V_{pp}$ is a program voltage, $V_F$ is a potential of the floating gate and $V_W$ and $V_E$ are potentials of the floating gate during each operation.

Thus, a shown in the above table, "to read" the device, that is, to determine whether the cell is in a high or low threshold state, 5 volts is placed on select gate 3, and 2 volts is placed on bit line 4, while control gate 17 and source line are placed at 0 volt. To "erase" the device, $V_{pp}$ is applied to the select gate 3 and the control gate 17, while the bit line 4 is maintained at 0 volt. This erase cycle will place a negative charge on the floating gate 2. To "write" the device, $V_{pp}$ is applied to the select gate and the bit line and 0 volt is applied to the control gate 17. This places positive charge on the floating gate 2.

FIG. 4A is an equivalent circuit diagram of the EEPROM shown in FIGS. 3A and 3B. Referring character $C_1$ is tunnel capacitance formed in a tunnel region. Reference character $C_2$ is capacitance formed by the floating gate 2, the control gate 17 and an insulating film therebetween. Reference character $C_3$ is stray capacitance which is formed by the floating gate 2 other than the tunnel region, the drain region 8 formed under the floating gate 2 and an insulating film therebetween. For example, an equivalent circuit during ERASE MODE is shown in FIG. 4B. At this time, a potential $V_F$ at a point F is represented by the following equation;

$$V_F = \frac{C_2}{C_1 + C_2 + C_3} V_{pp} \quad (1)$$

where $$\frac{C_2}{C_1 + C_2 + C_3}$$

is referred to as a coupling ratio, which is normally approximately 0.7.

An electric field of the tunnel insulating film and an amount of current flowing through the tunnel insulating film are represented by the following equations;

$$Eox = \frac{V_F}{Tox} \quad (2)$$

$$J = A\ Eox^2\ \exp(B/Eox) \quad (3)$$

where Eox is an electric field, Tox is a thickness of the tunnel insulating film, J is a current, and A and B are constants. If the equation (2) is substituted in the equation (1) assuming that the coupling ratio is 0.7 and Tox is 10 nm, the following equation, $Eox = 14$ MV/cm can be obtained. If this value is substituted in the equation (3), J becomes a sufficiently large value.

The above description is a summary of the conventional EEPROM.

Recently, computers have become of increased speed and capacity. Accordingly, an EEPROM has come to be demanded which is capable of being easily programmed an being highly integrated.

However, in order to integrate the EEPROM with a high density, the following problems must be solved. One of them is that the coupling ratio of the floating gate and the control gate needs to be kept above a constant value and another problem is that an area for the select gate transistor need to be reserved.

In order to solve these problems, the following measures have been conventionally taken. First, in order to reduce the area for the select transistor, $V_{pp}$ is lowered. If the $V_{pp}$ is lowered, a cut off voltage of the select transistor can be reduced. As a result, the select transistor becomes small. However, as described above, in order to obtain a sufficient tunnel current, the capacitance ratio needs to be raised as much as needed for that.

Another method is to make the area for the tunnel region small in order to make the capacitance ratio. More specifically, if $C_1$ becomes small, the denominator of the capacitance ratio becomes small and if $C_2$ is the same, the capacitance ratio becomes bigger. In this case, $C_3$ becomes large by an amount $C_1$ is reduced. However, capacitance is proportional to a facing area of electrodes and it is inversely proportional to a thickness of the insulating film therebetween. The thickness of the insulating film of $C_1$ is much smaller than that of $C_3$. Accordingly, the ratio of a change of $C_1$ is bigger than that of $C_3$. As a result, if the tunnel region is made small, the capacitance ratio becomes large. Besides the above description, various efforts have been made to raise the degree of integration. For example, there is the above described method in which $C_2$ is made large to raise the capacitance ratio. As a result, a highly integrated EEPROM described in U.S. Pat. No. 4,513,397 was invented.

FIG. 5A is a plan view showing the EEPROM disclosed in U.S. Pat. No. 4,513,397. FIG. 5B is a sectional view taken along a line VB—VB in FIG. 5A. FIG. 5C is a diagram showing an arrangement of memory cells of the EEPROM.

Referring to FIGS. 5A and 5B, a description is made of the EEPROM in which conventional writing/erasing characteristics have been improved. The conventional EEPROM is formed in a p well 31 formed on an n type substrate 11. The EEPROM comprises a first polysilicon layer 15 serving as a first control gate, a second polysilicon layer 2 serving as a floating gate formed thereon through an insulating film 24 and having one portion thereof extending under the first polysilicon layer, a third polysilicon layer 16 serving as a second control gate formed on the second polysilicon layer through an insulating film 27, n+ diffused layers 9 and 12 serving as a source and drain formed in the p well, and a field oxide film 10 for isolating elements.

When electrons are introduced to the floating gate, a constant voltage is applied to the control gates 15 and 16 with respect to the p well 31. As a result, electrons are introduced to the floating gate through a tunnel region 14. When electrons are drawn from the floating gate, a constant voltage is applied to the p well 31 with respect to the control gate 15 and 16. As a result, electrons are drawn to the drain 12 through the tunnel region 14. Electrons in the floating gate are read by applying a constant voltage to the control gates 15 and 16.

The conventional arrangement of EEPROM memory cells is shown in FIG. 5C. As can be seen from the figure, the second control gate serves as a word line in the conventional EEPROM.

In the conventional improved EEPROM, as previously stated, the value of $C_2$ is increased by forming the control gate of the first polysilicon 15 and the third polysilicon 16. As a result, a high degree of integration is attained to some extent and writing/erasing characteristic have been improved.

However, the conventional improved EEPROM eliminated a select transistor for the purpose of a high degree of integration. This EEPROM is divided with a well at every cell or every byte to select a cell at every well. As a result, conventional EEPROM, electrons are introduced or drawn between the floating gate 2 and the substrate 11. Therefore, it is necessary to apply a high voltage to the substrate to draw electrons.

FIG. 6A is a plan view showing a p well formed on an n type substrate and 6B is a cross sectional view taken along a line VIB—VIB in FIG. 6A. Referring to the figures, when the p well is formed on the n type substrate in general, the depth of the well d is 4 to 5 $\mu$m. Therefore, a p type region extends also in a horizontal direction (a plane direction) by 3 to 4 $\mu$m. Therefore, a wide isolation region of approximately 8 to 10 $\mu$m is needed in order to electrically isolate the plurality of p wells. The more the bytes exist, the larger area necessary for isolation between p wells becomes. Therefore, a high degree of integration is not possible in the structured EEPROM.

SUMMARY OF THE INVENTION

The present invention was made to solve the above described problems. It is an object of the present invention to provide a semiconductor memory device in which memory contents can be written or erased at a low voltage and also a high degree of integration is possible.

Another object of the present invention is to provide an EEPROM wherein a programming voltage is reduced.

A further object of the present invention is to provide an EEPROM wherein array integration density is increased.

A semiconductor memory device comprising a semiconductor substrate of a first conductivity type having a main surface and a predetermined impurity concentration, first, second and third impurity regions of a second conductivity type formed spaced apart from each other on the main surface of semiconductor substrate, the area between the first and second impurity regions of the second conductivity type defining a first channel region and the area between the second and third impurity regions of the second conductivity type defining a second channel region, a first conductor layer formed on first channel region through an insulating film, a second conductor layer formed on one portion of the second channel region through an insulating film, a third conductor layer formed through an insulating film on the second conductor layer, a first region on the second channel region excluding a region on which the second conductor layer is formed, and the second impurity region of the second conductivity type for storing charge representing information in accordance with a voltage applied to the second conductor layer, said second conductor layer having a stepped portion at said first region, and a fourth conductor layer formed on the third conductor layer through an insulating film, the insulating film formed between the third conductor layer, and second impurity region of the second conductivity type being a thin insulating film for passing a tunnel current and second conductor layer being electrically connected to the fourth conductor layer.

In a preferred embodiment of the present invention, a semiconductor memory device comprises a select gate transistor in which an n type impurity region formed on a main surface of a p type substrate serves as a source and drain and a first polysilicon layer formed on the substrate between the source and drain through an insulating film serves as a select gate, and a floating gate transistor connected to the select gate transistor in series and having two-layer control gates formed on upper-and-lower faces of the floating gates through a insulating film, electrons being introduced to or drawn from the floating gate by applying a high voltage to the select gate transistor.

In the semiconductor memory device in accordance with the present invention, coupling capacitance between the control gates and the floating gate can be increased because the control gates are the two-layer structure and the floating gate exists between them. In addition, it is not necessary to divide the substrate into a well at every byte because electrons are introduced to or drawn from a floating gate through the semiconductor region formed on the substrate.

These objects and other objects, features, aspects and advantages of the present invention will become more apparent from the following detailed description of the present invention when taken in conjunction with the accompanying drawings.

DESCRIPTION OF THE PREFERRED EMBODIMENTS

A description is made of one embodiment of the present invention in reference to the figures hereinafter.

Figure 1:
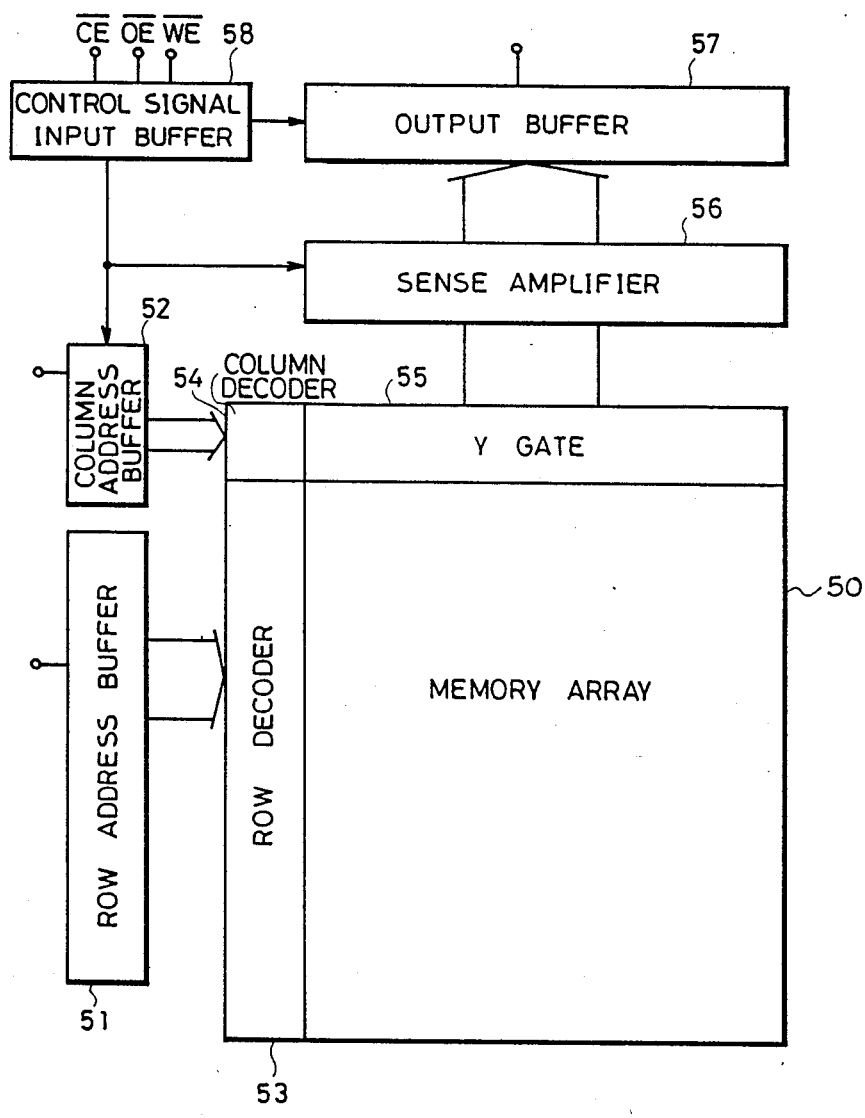
FIG. 1 is a block diagram showing an overall arrangement of an EEPROM.
Figure 2:
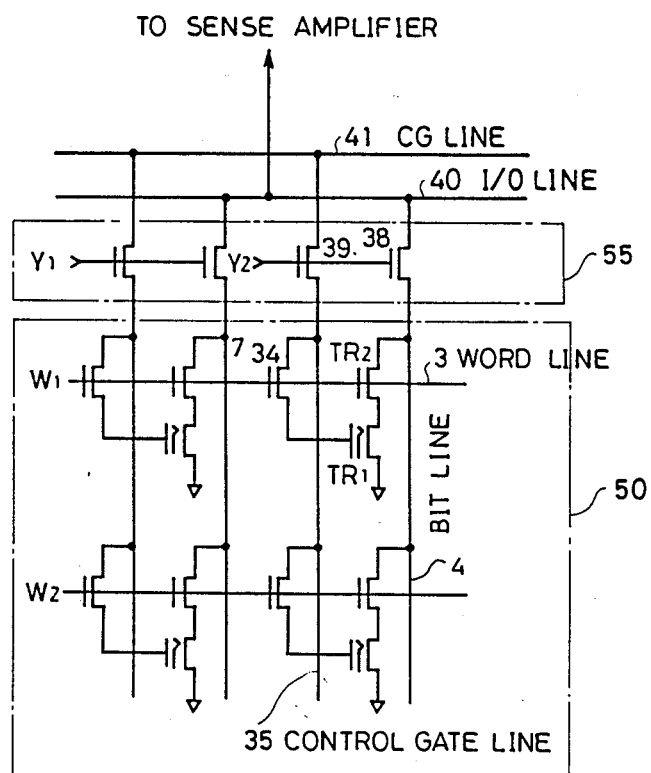
FIG. 2 is a schematic circuit diagram of the memory array and Y gate.
Figure 3A:
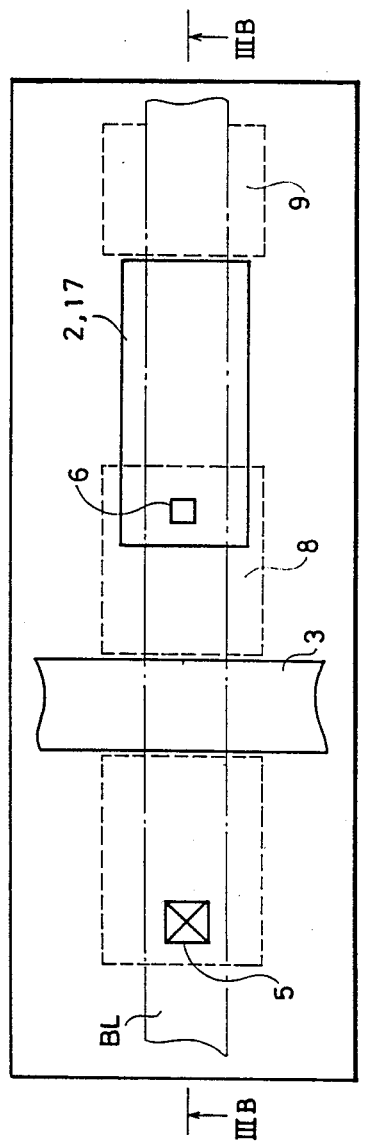
FIG. 3A is a plan view showing a conventional EEPROM.
Figure 3B:
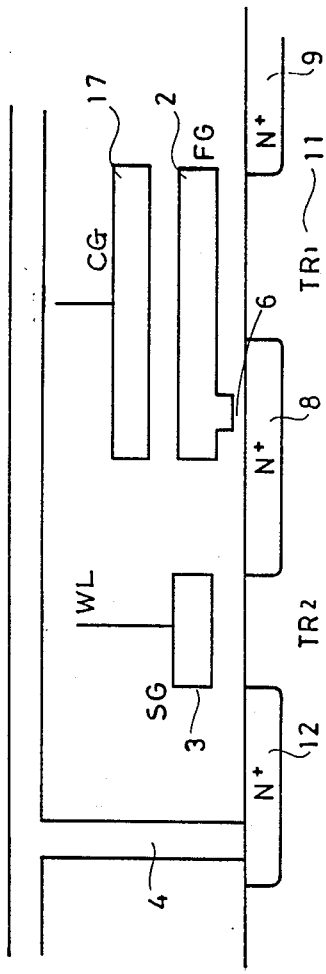
FIG. 3B is a sectional view taken along a line IIIB—IIIB of FIG. 3A.
Figure 4A:
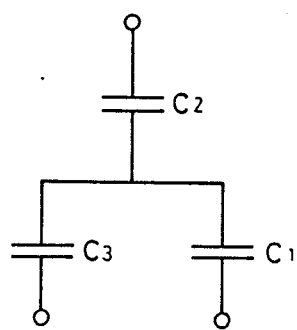
FIG. 4A is an equivalent circuit diagram of the EEPROM shown in FIGS. 3A and 3B.
Figure 4B:
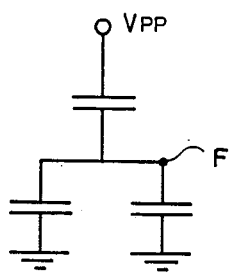
FIG. 4B is an equivalent circuit during ERASE MODE.
Figure 5A:
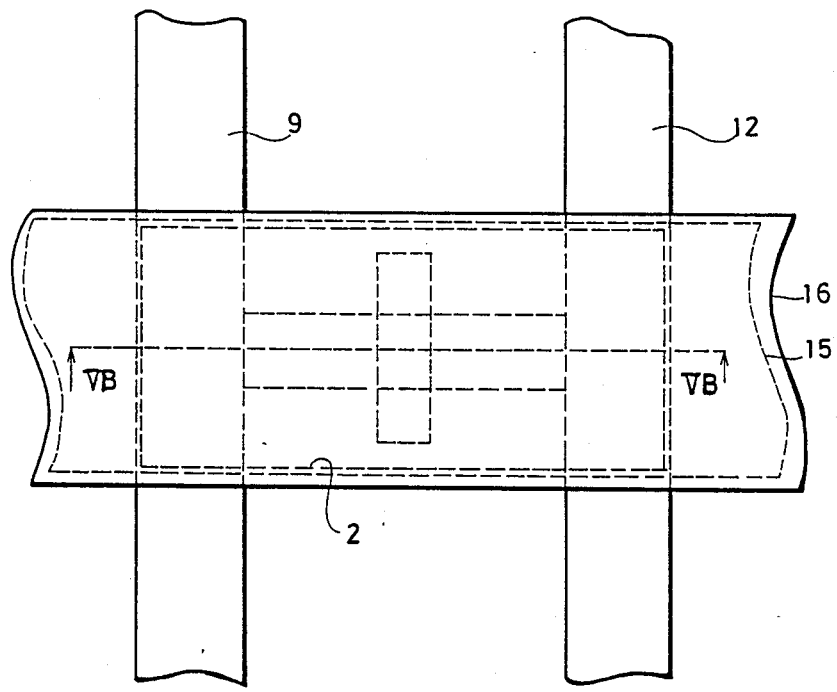
FIG. 5A is a plan view showing an improved conventional EEPROM.
Figure 5B:
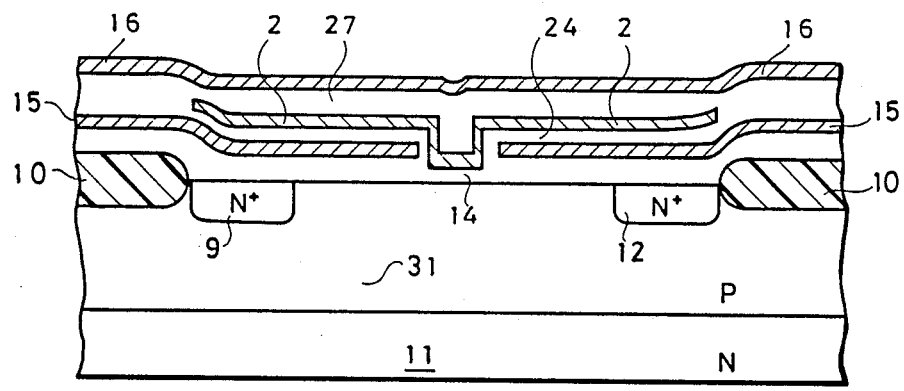
FIG. 5B is a sectional view taken along a line VB—VB of FIG. 5A.
Figure 5C:
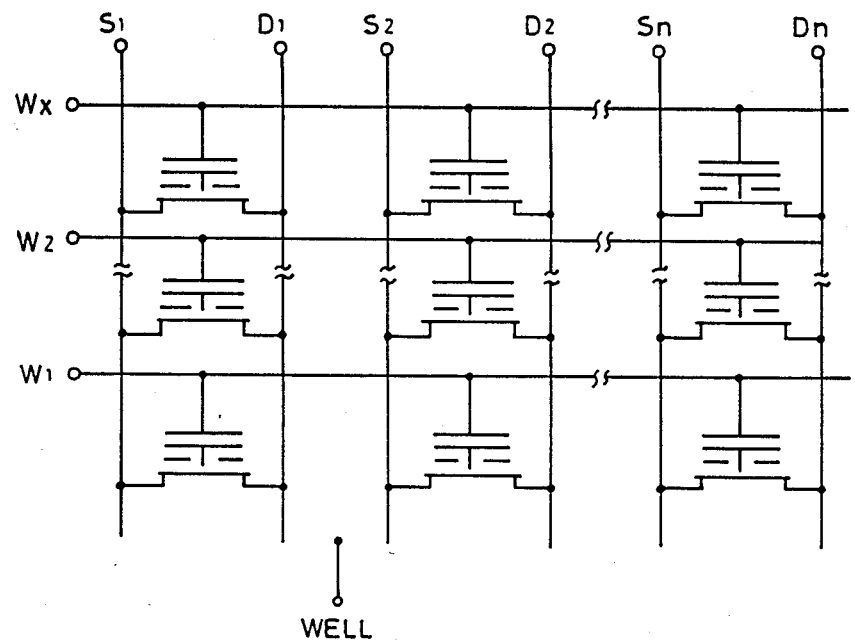
FIG. 5C is a diagram showing a configuration of improved conventional EEPROM memory cells.
Figure 6A:
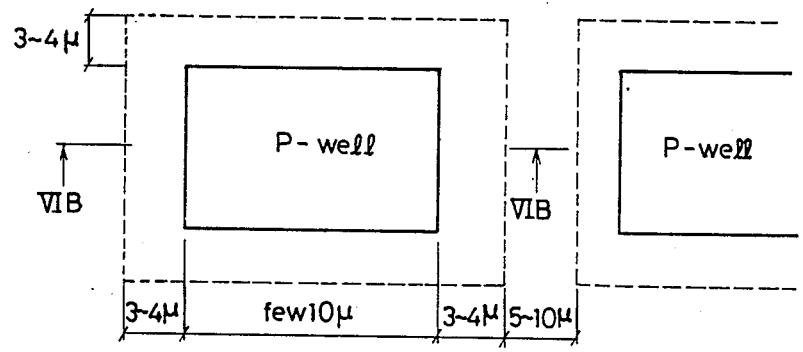
FIG. 6A is a plan view showing a p well formed on an n type substrate.
Figure 6B:
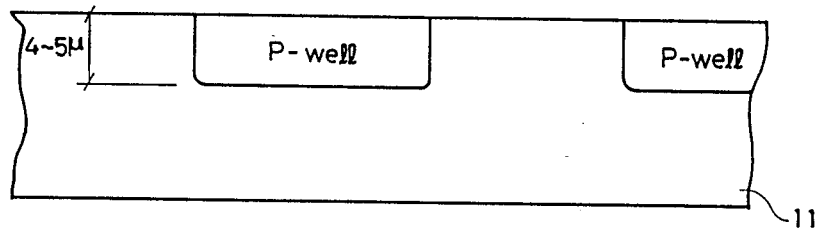
FIG. 6B is a cross sectional view taken along a line VIB—VIB.
Figure 7A:
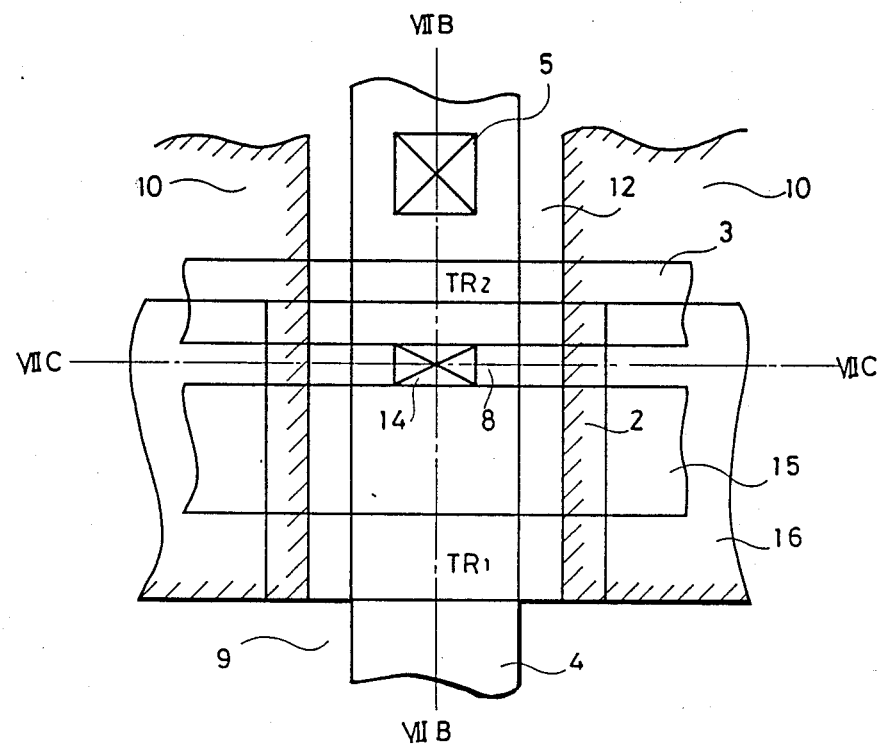
FIG. 7A is a plan view of a EEPROM in accordance with one embodiment of the present invention.
Figure 7B:
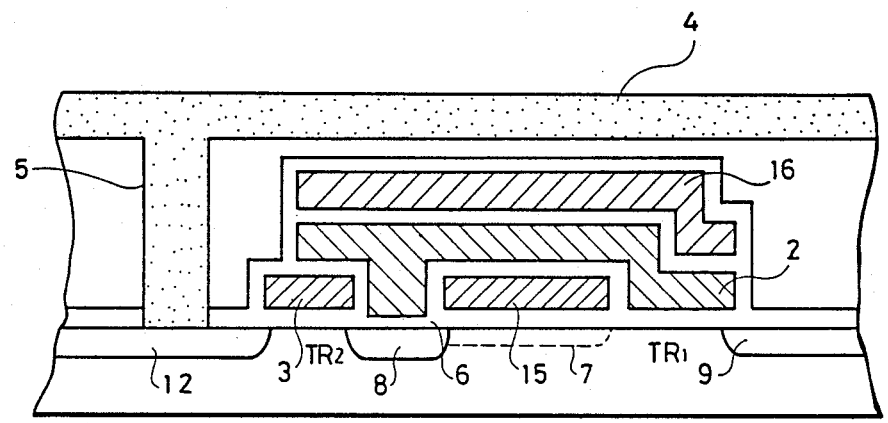
FIG. 7B is a sectional view taken along a line VIIB—VIIB in FIG. 7A.
Figure 7C:
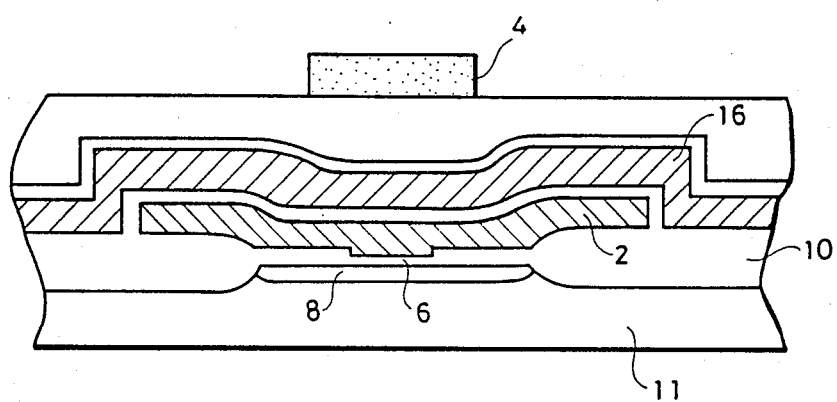
FIG. 7C is a sectional view taken along a line VIIC—VIIC of FIG. 7A.

With reference to FIGS. 7A to 7C, the semiconductor memory device comprises a floating gate transistor TR1 and a select transistor TR2 formed on a main surface of a semiconductor substrate 11.

The floating gate transistor comprises a source and drain regions 8 and 9 formed on a main surface of the semiconductor substrate 11, a first control gate 15 formed on the semiconductor substrate 11 through an insulating film, a floating gate 2 formed on the first control gates 15 through the insulating film, and a second control gate 16 formed on the floating gate 2 through the insulating film. The source and drain regions 8 and 9 are formed by diffusing an impurity having a conductivity type opposite to the semiconductor substrate 11 on a main surface of the semiconductor substrate 11.

The select transistor TR2 comprises the source region 8, and a drain region 12 connected to a bit line through a contact hole 5, both of which are formed on a main surface of the semiconductor substrate 11, and a select gate 3 formed on the semiconductor substrate 11 through the insulating film.

There is an impurity diffused layer 8 including a tunnel region 14 (the impurity diffused layer 8 is the source region of the floating gate transistor TR1 and also the source region of the selective transistor TR2 as described above) between the floating gate transistor TR1 and the selective transistor TR2.

The impurity diffused layer 8 is covered by the floating gate 2 in the plan view. The tunnel region 14 is disposed so as to be completely covered with the floating gate 2. The tunnel region 14 comprises a tunnel insulating film 6 formed on a main surface of the semiconductor substrate 11 and the impurity diffused layer 8. One end portion of the tunnel region 14 is defined by the select gate 3 and the first control gate 15. The other end portion of the tunnel region is defined so as to cross the select gate 3 and the first control gate 15 at right angles.

Figure 8:
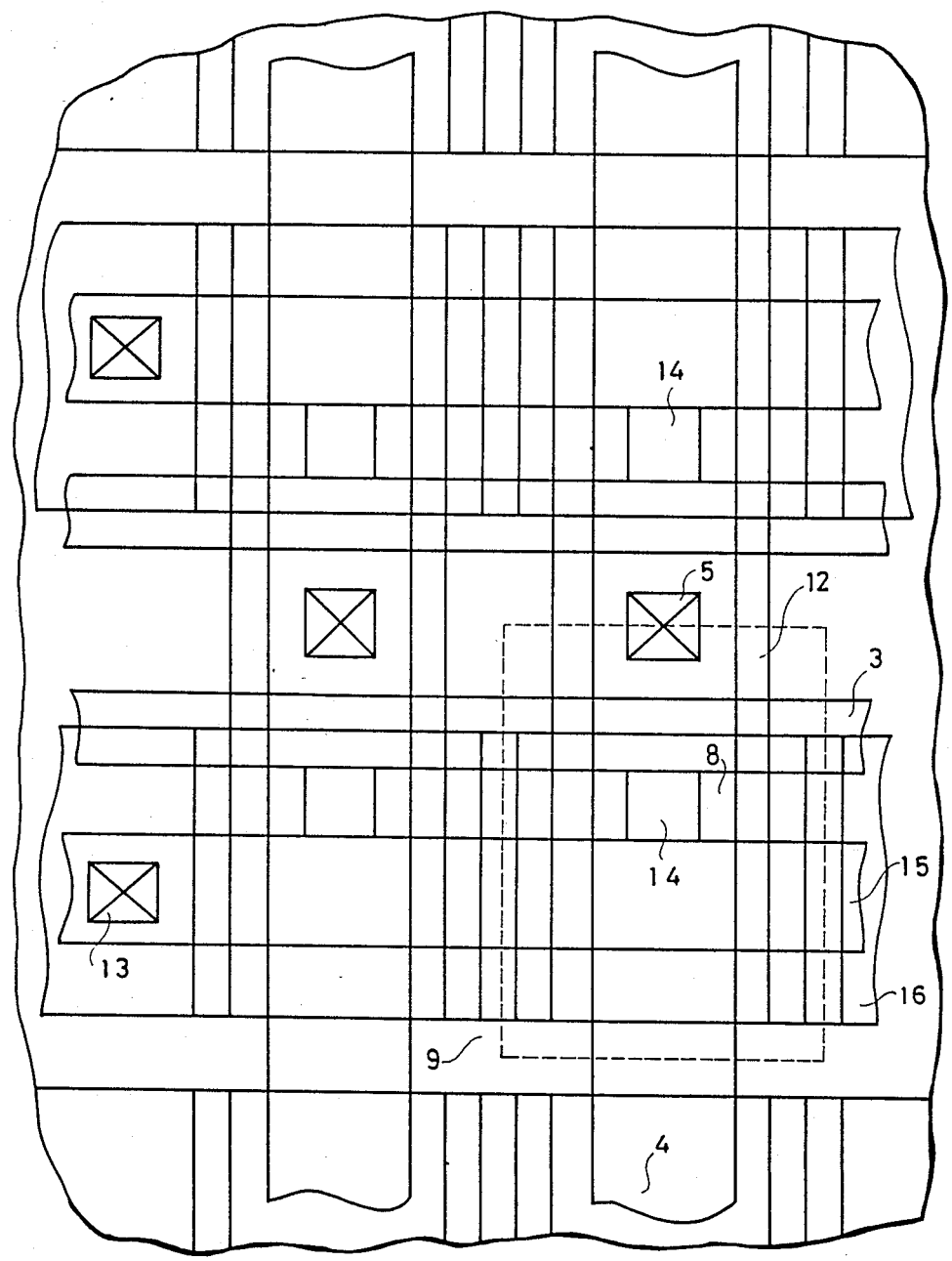
FIG. 8 is a plan view showing the EEPROM's in FIG. 7A disposed in an array fashion.

FIG. 8 is a plan view showing one-bit memory cells in FIG. 7A disposed on an array. The portion enclosed by a dotted line in FIG. 8 corresponds to one bit portion. The contact hole 13 serves to connect the first control gate 15 to the second control gate 16 in FIG. 7B. It is necessary to electrically connect the control gate 15 to the second control gate 16 at least at one point in the same byte in order to maintain the first and second control gates 15 and 16 at the same potential.

Now, a description is made of operation of the EEPROM according to the present invention. EEPROM has three basic operational mode, such as Read, Erase and Write.

The following table shows the potentials which are applied to the various elements of the device herein described in order to read, erase and write any charge on floating gate. The various potentials shown under the columns entitled "READ" "ERASE" and "WRITE" are applied to those elements shown under the column entitles "ELEMENT" in the following table:

| ELEMENT | READ | ERASE | WRITE |
| --- | --- | --- | --- |
| Select gate 3 | 5V | $V_{pp}$ | $V_{pp}$ |
| Control gate 15, 16 | Appropriate potential | $V_{pp}$ | 0 |
| Bit line | Appropriate potential | 0 | $V_{pp}$ |
| Source line 9 | 0V | 0V | Floating |
| Floating gate 2 | $V_F$ | $V_E$ | $V_W$ | where $V_{pp}$ is a program voltage, $V_F$ is a potential of the floating gate and $V_W$ and $V_E$ are potentials of the floating gate during each operation.

A detail description is made of operation in reference to above table FIGS. 7A, 7B and 7C. When electrons are introduced to the floating gate 2, the select gate 3 is brought to a high voltage. As a result, the select transistor TR2 is turned on and a bit line 4 is set at 0 V. The first control gate 15 and the second control gate 16 are set at a program voltage. A source line 9 is set at 0 V. When electrons are drawn from the floating gate 2, the select gate 3 is set at a high voltage. As a result, the select transistor TR2 is turned on and the bit line 4 is set at a program voltage. The first control gate 15 and second control gate 16 is set at 0 V. The source region 9 is rendered to be a floating state. A high electric field is applied to the tunnel insulating film 6 by setting a potential as described above and, as a result, a tunnel current is started to flow. At the time of reading, the select transistor TR2 is turned on. An appropriate potential is applied to the bit line 4. An appropriate potential is applied to the first control gate 15 and the second control gate 16. At this time, an inversion layer 7 is formed under the first control gate 15. The source region 9 is set at 0 V. A decision is made whether a channel is to be formed between the inversion layer 7 and the source region 9 at this state. A binary state of the floating gate is checked, in accordance with the result.

Figure 9:
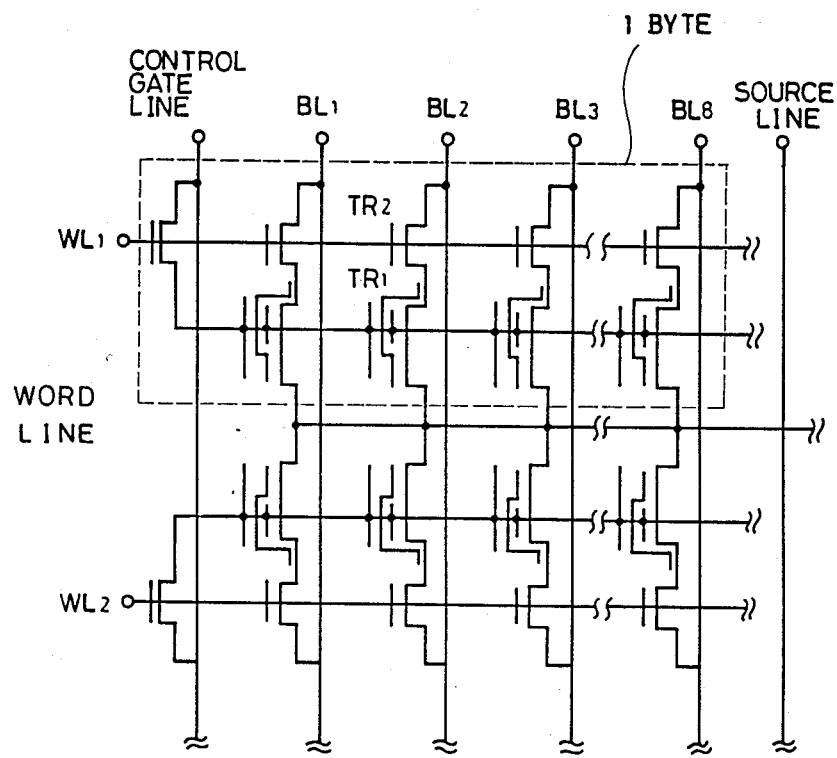
FIG. 9 is a diagram showing an arrangement of memory cells of the EEPROM in accordance with the present invention.

An arrangement of memory cells of the EEPROM in accordance with the present invention is shown in FIG. 9. As can be seen from the figure, the EEPROM in accordance with the present invention has a gate electrode of the select transistor TR2 connected to the word line and the first and second control gates connected to the control gate line.

A manufacturing process of the EEPROM in accordance with the present invention is described in reference to FIGS. 10A to 10I.

Figure 10A:
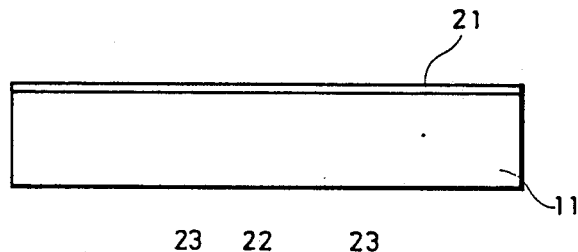
FIGS. 10A to 10I are views showing manufacturing process of the EEPROM in accordance with the present invention.
Figure 10B:
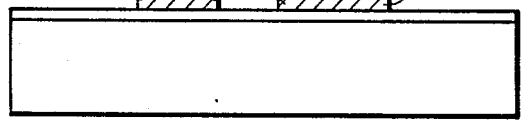
Figure 10C:
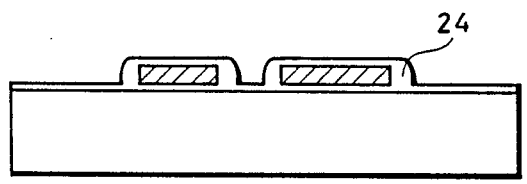
Figure 10D:
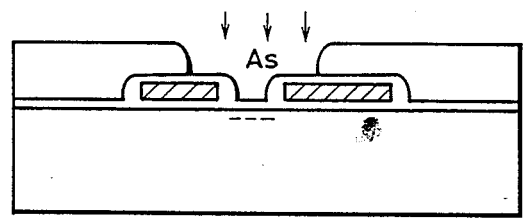
Figure 10E:
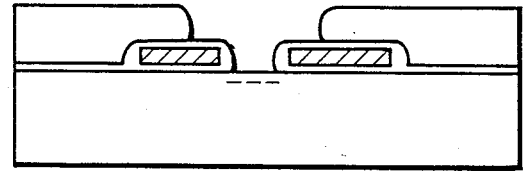
Figure 10F:
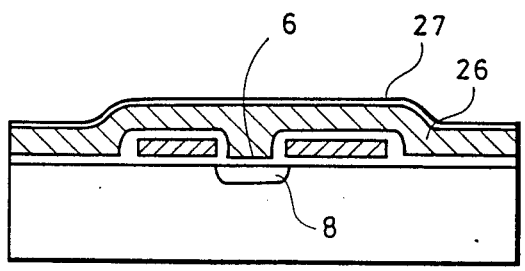
Figure 10G:
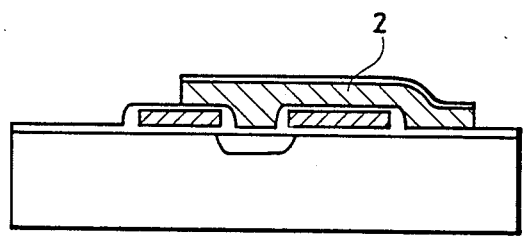
Figure 10H:
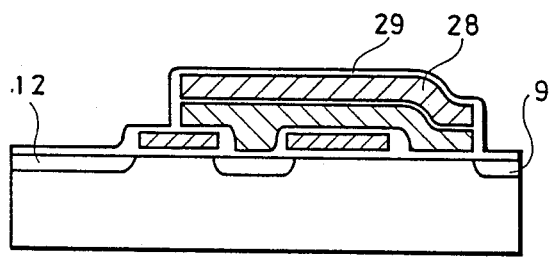
Figure 10I:
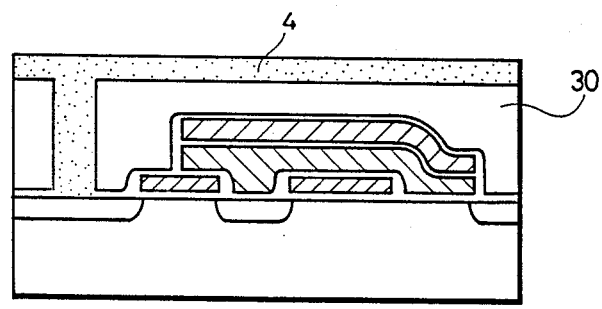

First, the substrate 11 is prepared and the first gate oxide film 21 is formed thereon FIG. 10A). A first polysilicon layer 22 of n type is forked on the first gate oxide film and a two-layer film 23 of an oxide film and a nitride film is formed thereon. As a result, the pattern of the select gate 3 and the first control gate 15 is formed by etching (FIG. 10B). After the first gate oxide film is etched away, a second gate oxide film 24 is formed (FIG. 10C). A photoresist 25 is formed on the second gate oxide film 24. Ion implantation is made of arsenic in aperture region between the select gate 3 and the first control gate 15 (FIG. 10D). The first gate oxide film 21 of the tunnel region 14 in the above mentioned aperture is removed (FIG. 10E). The photoresist 25 is removed and the tunnel oxide film is formed to be approximately 10 nm in thickness. A polysilicon 26 of n type is formed on the second gate oxide film 24 and the tunnel region 14. A two-layer film 27 of an oxide film and an nitride film is formed on the second polysilicon layer 26 of n type (FIG. 10F). A pattern of the floating gate 2 is formed (FIG. 10G). A third polysilicon layer 28 of n type is formed on the floating gate 2. An oxide film 29 is formed on the third polysilicon layer 28. A pattern of the second control gate is formed. Ion implantation is made of arsenic on either end portion of a three-layer structure of polysilicon and on a main surface of the substrate 11. As a result, an n type source and drain region are formed on a main surface of the substrate 11 (FIG. 10H). An oxide film 30 is formed on the three layers of polysilicon, n type source and drain region. An aluminum connection layer serving as a bit line is formed on the oxide film 30 to connect the abovementioned n type source region (FIG. 10I). A metal connection layer and the like are formed in accordance with an ordinary process thereafter. As a result, the EEPROM in accordance with the present invention is completed.

As a result of provision of select gate transistor having the structure, orientation, and operation shown and described, isolation between cells is improved over conventional p well isolation. Accordingly integration density as well as cell isolation in an EEPROM array is improved.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
    a semiconductor substrate of a first conductivity type having a main surface and a predetermined impurity concentration;
    a first, second and third impurity regions of a second conductivity type formed spaced apart from each other on the main surface of said semiconductor substrate,
    the area between said first and second impurity regions of the second conductivity type defining a first channel region and the area between said second and third impurity regions of the second conductivity type defining a second channel region;
    a first conductor layer formed on said first channel region through an insulating film;
    a second conductor layer formed on one portion of said second channel region through an insulating film;
    a third conductor layer formed through an insulating film on said second conductor layer, a first region on said second channel region excluding a region on which said second conductor layer is formed, and said second impurity region of the second conductivity type for storing charge representing information in accordance with a voltage applied to said second conductor layer, said second conductor layer having a stepped portion at said first region; and
    a fourth conductor layer formed on said third conductor layer through an insulating film,
    the insulating film formed between said third conductor layer, and said second impurity region of the second conductivity type being a thin insulating film for passing a tunnel current and said second conductor layer being electrically connected to said fourth conductor layer.

2. A semiconductor memory device in accordance with claim 1 wherein said fourth conductor layer has a stepped portion at said stepped portion of said third conductor layer.

3. A semiconductor memory device in accordance with the claim 2, wherein said first conductor layer, said first impurity region of the second conductivity type and said second impurity region of the second conductivity type form a first field effect transistor, said first conductor layer comprises a gate electrode, said first impurity region of the second conductivity type comprises a region of either a drain or a source, and said second impurity region of the second conductivity type comprises the other region either of a drain or a source.

4. A semiconductor memory device in accordance with claim 3, said second, third and fourth conductor layers, said second impurity region of the second conductivity type and said third impurity region of the second conductivity type form a second field effect transistor, said second conductor layer and said fourth conductor layer comprise control gate electrodes, said third conductor layer comprises a floating gate electrode, said second impurity region of the second conductivity type comprises a region of either a drain or a source, and said third impurity region of the second conductivity type comprises the other region of either a drain or a source.

5. A semiconductor memory device in accordance with claim 4, wherein said first field effect transistor comprises a select gate transistor, said second filed effect transistor comprises a floating gate transistor, and said first impurity region of the second conductivity type is connected to a bit line,
    whereby a first potential is applied to said select gate, a second potential is applied to said control gate, electric charge representing information is written to said floating gate when 0 V is applied to said bit line,
    the first potential is applied to said select gate, the second potential is applied to said bit line, and electric charge representing information is erased from the said floating gate when 0 V is applied to said control gate.

6. A semiconductor memory device comprising a semiconductor substrate of a first conductivity type having a main surface and a predetermined impurity concentration and a plurality of memory cells spaced apart and insulated from each other on said semiconductor substrate, said each memory cell comprising:
    a first, second and third impurity regions of a second conductivity type formed spaced apart from each other on the main surface of said semiconductor substrate,
    the area between said first and second impurity regions of the second conductivity type defining a first channel region and the area between said second and third impurity regions of the second conductivity type defining a second channel region;
    a first conductor layer formed on said first channel region through an insulating film;
    a second conductor layer formed on one portion of said second channel region through an insulating film;
    a third conductor layer formed through an insulating film on said second conductor layer, a region on said second channel region excluding a region on which said second conductor layer is formed, and said second impurity region of the second conductivity type for storing charge representing information in accordance with a voltage applied to said second conductor layer, said second conductor layer having a stepped portion at said first region; and a fourth conductor layer formed on said third conductor layer through an insulating film, the insulating film formed between said third conductor layer, and said second impurity region of the second conductivity type being a thin insulating film for passing a tunnel current and said second conductor layer being electrically connected to said fourth conductor layer said plurality of memory cells sharing said second conductor layer and said fourth conductor layer, and said second conductor layer and said fourth conductor layer being connected at common connection portion to said plurality of memory cells.

7. A semiconductor memory device in accordance with claim 6, wherein said first conductor layer, said first impurity region of the second conductivity type and said second impurity region of the second conductivity type form a first field effect transistor, said first conductor layer comprises a gate electrode, said first impurity region of the second conductivity type comprises a region of either a drain or a source, and said second impurity region of the second conductivity type comprises the other region either of a drain or a source.

8. A semiconductor memory device in accordance with claim 7, said second, third and fourth conductor layers, said second impurity region of the second conductivity type and said third impurity region of the second conductivity type form a second field effect transistor, said second conductor layer and said fourth conductor layer comprise control gate electrodes, said third conductor layer comprises a floating gate electrode, said second impurity region of the second conductivity type comprises a region of either a drain or a source, and said third impurity region of the second conductivity type comprises the other region of either a drain or a source.

9. A semiconductor memory device in accordance with claim 8, wherein said first field effect transistor comprises a select gate transistor, said second field effect transistor comprises a floating gate transistor, and said first impurity region of the second conductivity type is connected to a bit line, whereby a first potential is applied to said select gate, a second potential is applied to said control gate, electric charge representing information is written to said floating gate when 0 V is applied to said bit line, the first potential is applied to said select gate, the second potential is applied to said bit line, and electric charge representing information is erased from the said floating gate when 0 V is applied to said control gate.

* * * * *